(12) United States Patent
Kruip

(10) Patent No.: US 8,148,987 B2
(45) Date of Patent: Apr. 3, 2012

(54) MAGNETIC RESONANCE DEVICE

(75) Inventor: Marcel Jan Marie Kruip, Oxford (GB)

(73) Assignee: Siemens PLC, Frimley, Camberley (GB)

( * ) Notice: Subject to any disclaimer, the term of this patent is extended or adjusted under 35 U.S.C. 154(b) by 209 days.

(21) Appl. No.: 12/718,328

(22) Filed: Mar. 5, 2010

(65) Prior Publication Data

US 2010/0225321 A1    Sep. 9, 2010

(30) Foreign Application Priority Data

Mar. 6, 2009   (GB) .................................. 0903868.8

(51) Int. Cl.
*G01V 3/00* (2006.01)
(52) U.S. Cl. ........................................................ 324/318
(58) Field of Classification Search ........... 324/300–323
See application file for complete search history.

(56) References Cited

U.S. PATENT DOCUMENTS

| | | | |
|---|---|---|---|
| 4,342,336 A * | 8/1982 | Satterthwaite et al. | 138/90 |
| 4,639,672 A * | 1/1987 | Beaumont | 324/318 |
| 5,221,077 A * | 6/1993 | Noguchi | 267/140.12 |
| 5,429,343 A * | 7/1995 | Maeno et al. | 267/140.12 |
| 5,954,317 A * | 9/1999 | Meyer et al. | 267/140.12 |
| 6,107,799 A | 8/2000 | Sellers et al. | |
| 6,349,926 B1 * | 2/2002 | Itoh | 267/140.12 |
| 6,450,486 B1 * | 9/2002 | Satori et al. | 267/140.12 |
| 6,666,437 B2 * | 12/2003 | Larmande et al. | 267/141.2 |
| 6,831,461 B2 * | 12/2004 | Arz et al. | 324/318 |
| 6,894,497 B2 | 5/2005 | Renz | |
| 7,052,004 B2 * | 5/2006 | Siemer et al. | 267/141 |
| 7,219,882 B2 * | 5/2007 | Kato | 267/140.12 |
| 8,038,132 B2 * | 10/2011 | Thornhill et al. | 267/140.12 |
| 2004/0061499 A1 | 4/2004 | Stocker | |
| 2006/0186873 A1 | 8/2006 | Schuster et al. | |
| 2007/0182415 A1 * | 8/2007 | Schuster et al. | 324/318 |

FOREIGN PATENT DOCUMENTS

| | | |
|---|---|---|
| DE | 10 2004 047 344 A1 | 1/2006 |
| JP | 11225983 | 8/1999 |
| JP | 2005245775 A | 9/2005 |

OTHER PUBLICATIONS

Miscellaneous—Intellectual Property Search Report under Section 17.

* cited by examiner

*Primary Examiner* — Melissa Koval
*Assistant Examiner* — Daniel Miller
(74) *Attorney, Agent, or Firm* — Schiff Hardin LLP

(57) ABSTRACT

A magnetic resonance device has a cryostat and a gradient coil assembly situated within an inner bore of the cryostat. A seal is positioned between the gradient coil assembly and the inner bore. The seal includes a first fluid filled toroid or helix mounted concentrically with the gradient coils; and a second fluid filled toroid or helix situated within the first toroid, or first helix.

20 Claims, 6 Drawing Sheets

MAGNETIC RESONANCE DEVICE

BACKGROUND OF THE INVENTION

1. Field of the Invention

This invention relates to a magnetic resonance device, for use in magnetic resonance imaging (MRI) systems, in particular a device of the type having a compliant seal and acoustic barrier.

2. Description of the Prior Art

A problem with MRI systems is that noise is generated by the gradient coils of the MRI scanners. The current applied to gradient coils within a gradient coil assembly during an MRI excitation results in vibration of the gradient coil assembly. During an imaging cycle of an MRI scanner the gradient coils are pulsed with high current at frequencies up to 3 kHz. This sequencing creates large non-symmetrical internal forces within the gradient coil assembly as well as an alternating stray electromagnetic field that penetrates outwardly into the outer vacuum chamber (OVC) structure and beyond. These phenomena result in direct mechanical vibrations of the gradient coil assembly that are transferred into the bore tube of the OVC, as well as the formation of eddy currents within the surrounding conductive material that stimulate magnetic field interferences and electromagnetically induced vibration within these conductive structures. Noise generated is coupled to the outside world through the mechanical contact between the gradient coil and the OVC bore tube, as well as by acoustic transmission through the air gap between the gradient coil and the OVC bore tube. This gap is the result of the required clearance to allow mounting of the gradient coil The quantifiable effects of the vibration and eddy current formation are that noise occurs during imaging, causing patient and operator discomfort; the induced eddy currents disturb the magnetic field within the imaging volume causing image ghosting; and gradient stray fields penetrate the OVC and induce eddy currents and vibrations within the thermal shield resulting in helium boil-off.

The manner of fixing of the gradient coil assembly onto the OVC can affect the degree to which the above phenomena occur. Conventionally, twenty four injection molded wedges, twelve at each end, rigidly fix the gradient coil assembly to the OVC bore tube. This rigid fixing provides a path for the mechanical vibration to pass into the surrounding OVC structure, thus increasing the noise and vibration of the system and also creating secondary induced eddy currents within the material due to its movement within the strong magnetic environment.

DE 10 2004 047344 provides sound and vibration isolation using an elastomeric seal. A sound and vibration damping former is made of fiber layers around an elastomer foil and gaps are provided in the elastomer foil as a passageway for not yet hardened poured resin.

JP2005245775 describes a gradient coil mounting system consisting of liquid filled pads, whose viscosity can be actively controlled to adjust the spring constant and the viscous damping co-efficient according to a sequence.

GB2395279 describes using cushions dispersed around and stuck onto movable gradient coil units, to fix, as well as to provide vibration damping for the movable units, by pumping up the cushions, which can be filled with gas, liquid or foam.

SUMMARY OF THE INVENTION

It is an object of the present invention to provide a magnetic resonance apparatus with improved noise alleviation.

The above object is achieved in accordance with the present invention in a first embodiment by a magnetic resonance apparatus having a cryostat with an inner bore therein and a gradient coil assembly situated within the inner bore of the cryostat, and a seal between the gradient coil assembly and the inner bore, the seal assembly being formed by a first fluid-filled toroid mounted concentrically with respect to the gradient coil assembly, and a second fluid-filled toroid situated within the first toroid.

The above object also is achieved in accordance with the present invention in a further embodiment of a magnetic resonance device having a cryostat, and also having a gradient coil assembly situated within the inner bore of the cryostat, and a seal between the gradient coil assembly and the inner bore, the seal being formed by a first fluid-filled helix mounted concentrically with respect to the gradient coil assembly, and a second fluid-filled helix situated within the first helix.

DESCRIPTION OF THE PREFERRED EMBODIMENTS

Figure 1:
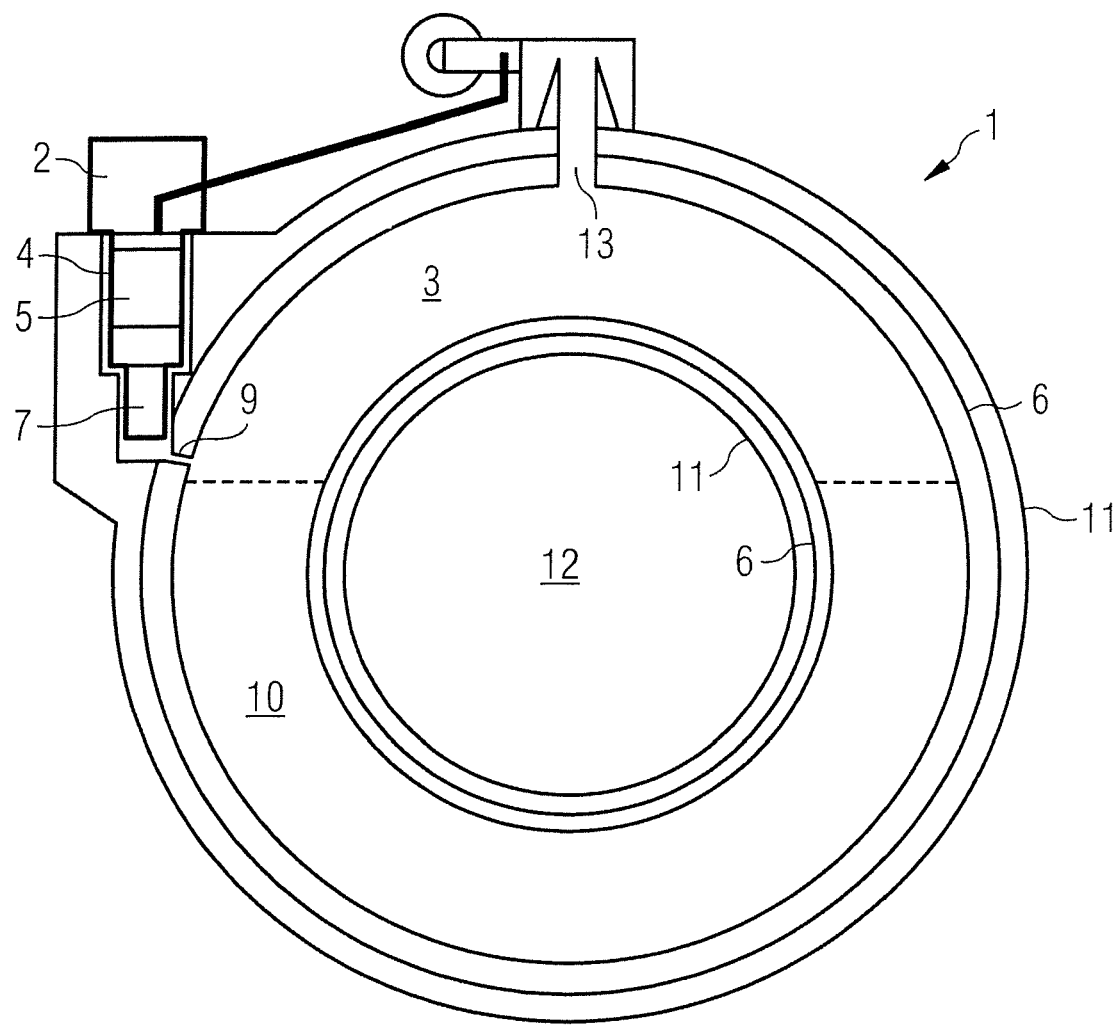
FIG. 1 shows an example of a conventional arrangement of a superconducting magnet system.

FIG. 1 shows a cross-section of a conventional superconducting magnet system 1 for use in an MRI system, including a cryostat. The cryostat comprises a thermal shield 6 and an outer vacuum chamber 11; and in the case where a convective cooling loop is not employed, the cryostat further comprises a cryogen vessel 3, encased within the thermal shield and OVC. A two-stage cryogenic refrigerator 2 is removably connected to the magnet system 1 by an interface sock 4 (also known as an interface sleeve, or refrigerator interface), such that the first stage 5 of the refrigerator is thermally linked to the thermal shield 6 to cool the thermal shield 6 and the second stage 7 cools the cryogen vessel 3. The refrigerator is preferably, but not necessarily, arranged as a recondensing refrigerator. A heat exchanger, cooled by the second stage 7 of the refrigerator 2, is exposed to the interior of the cryogen vessel 3, for example by a tube 9. The refrigerator is, in operation, thereby enabled to reduce the consumption of cryogen by recondensation of evaporated cryogen back into its liquid state.

Superconductive magnet coils (not shown) are provided in the cryogen vessel. The coils may be immersed in a liquid cryogen 10, or alternatively, cooling may be provided to the magnet coils by means of a convection cooling loop (not shown) comprising a tube around the coils supplying cooled helium gas from the refrigerator 2. The thermal shield 6 completely surrounds the cryogen vessel 3. An OVC vacuum jacket completely encloses the cryogen vessel and the shield in a vacuum. A gradient coil assembly (not shown) is positioned within an inner bore of the magnet system 1 and a central bore 12 is provided, to accommodate a patient for examination. An access neck 13 is provided to allow access to the cryogen vessel 3. The access neck 13 is thermally linked to the thermal shield 6.

Figure 2:
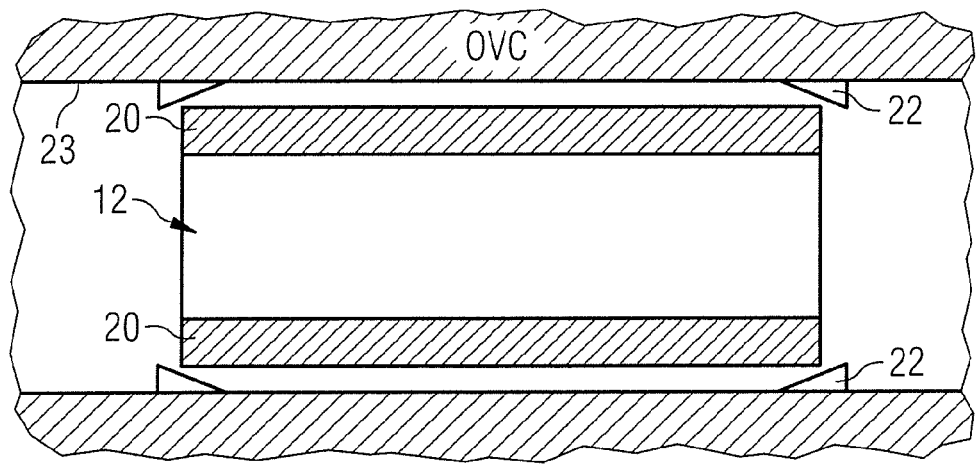
FIG. 2 illustrates a conventional fixing arrangement for gradient coil assembly of the system of FIG. 1.

FIG. 2 illustrates how, conventionally, a gradient coil assembly 20 is mounted within an OVC inner bore 23 using rigid wedges 22. However, these tend to transmit vibration into the inner bore 23 and also give rise to high point loading through the wedges 22 onto the inner bore.

There have been some attempts to address the problem of vibration transmission from the gradient coil assembly as described in the introduction, but these operate in different ways. For example in JP2005245775 liquid filled pads are used, but there is no suggestion of providing a seal between the gradient coil assembly and the OVC inner bore using a continuous tube. Similarly, in GB2395279 various cushions are placed around the gradient coils, stuck on and pumped up, but are not used to provide a seal.

The magnetic fields at the ends of the OVC have very strong gradients, i.e. the magnetic field is very inhomogeneous. A conductor which is forced to vibrate in the direction of the gradient of this magnetic field will have eddy currents induced inside it and these currents result in a Lorentz force. In the invention a tubular system for suspending gradient coils provides acoustic and vibrational isolation. The aim is to provide a good acoustic seal of the gap between the gradient coil assembly 20 and the OVC inner bore 23, whilst at the same time aiming to provide a soft support for the gradient coil assembly. In one example, flexible tubular seals, are fitted towards the ends of the gradient coil assembly. A seal which is sufficiently heavy to act as an acoustic barrier, keeping sound within the gap, while remaining flexible enough to provide a compliant seal, is desired. Although one option to achieve the desired result is to use a single gas filled tubular seal, preferably, the seal is composed of two seals, one within the other, one liquid filled, the other gas filled. The liquid gives density and acoustic isolation, while the inside gas filled tube provides flexibility. Filling the inside tube with liquid, rather than a gas, results in a similar effect to having a single gas filled tube. The stiffness of the seal can be controlled by the amount of the liquid and the pressure of the gas. Among the advantages of the invention are that the seal can be fitted, even when there is only a narrow gap available between the gradient coil assembly and the OVC bore; there is good isolation of acoustic noise generated in the gap between the gradient coil assembly and the OVC, which can be further improved by evacuating the space between the seals; and the seal provides a mechanical isolation between the gradient coil assembly and the OVC with a tunable stiffness.

Figure 3:
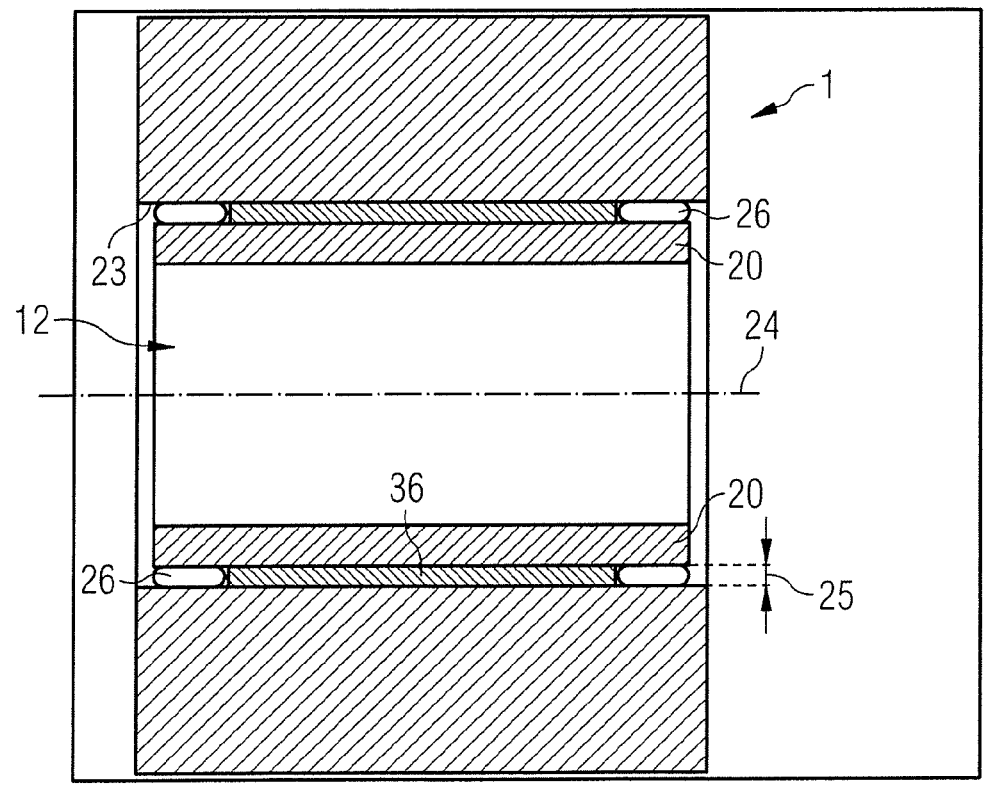
FIG. 3 illustrates a first example of a magnetic resonance device according to the present invention, using a toroidal seal.

FIG. 3 shows a cross section of an MRI scanner with a gradient coil assembly in an example of a first embodiment of the present invention. Within the OVC inner bore 23, the gradient coil assembly 20 is nominally concentrically mounted with the magnet assembly 1 about center line 24. Typically the inner bore and gradient coil assembly are both substantially cylindrical. There is a gap 25 between the inner bore 23 and the outside radius of the gradient coil assembly 20. Where this gap would normally receive wedges 22 as shown in FIG. 2, to hold the gradient coil assembly in position within the bore 23, the present invention uses a concentric seal 26 which closes off the gap 25. A single toroidal seal provides some of the benefits of the present invention, but generally, at least two seals are provided, preferably, one toward each end of the gradient coil assembly, forming an air-tight section 36 between the seals 26, the outer surface of the gradient coil assembly 20 and the part of the surface of the inner bore 23 which faces the gradient coil assembly.

The arrangement shown in FIG. 3 with two seals, results in a gradient coil assembly mounting which is slightly off-centered in the vertical direction due to the weight of the coil assembly compressing the part of the seal beneath it. For the seal 26 to be effective, it needs to be able to support the weight of the gradient coil assembly 20, which is typically about 7000 N. The seal should be acoustically tight and also soft, so that it decouples vibrations from the gradient coil at high frequencies, typically at greater than 500 Hz. The seal is also designed to be tolerant to out of roundness of the gradient coil assembly 20 and/or the OVC inner bore 23.

Figure 4A:
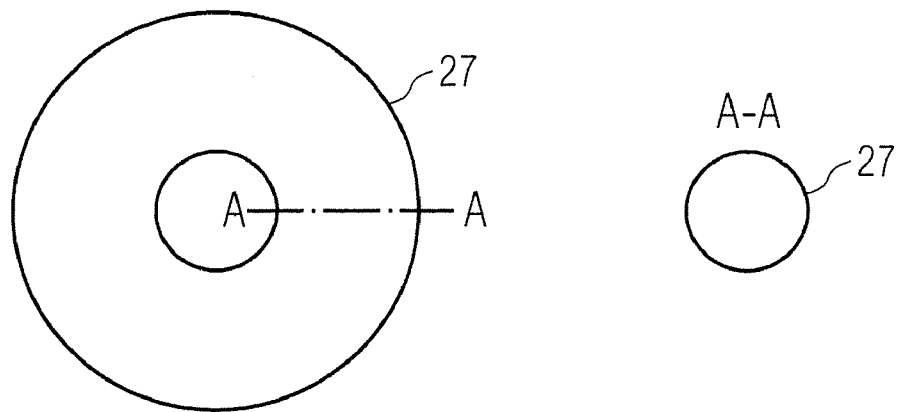
FIGS. 4A, 4B and 4C illustrate examples of construction of a seal of the device of FIG. 3 in more detail.
Figure 4B:
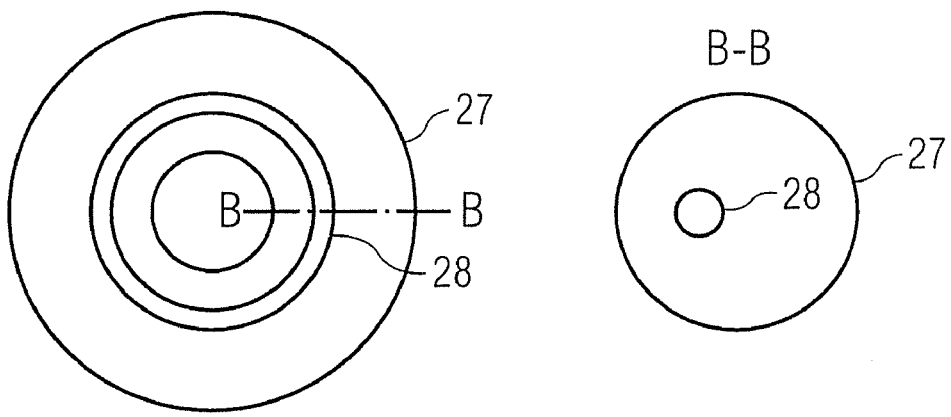
Figure 4C:
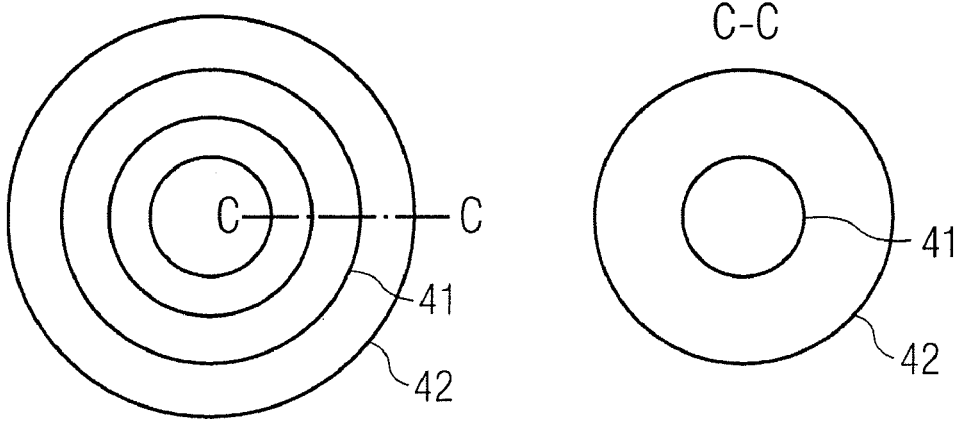

In the example of FIG. 4A, the seal 26 is shown as a single gas filled tube. Preferably, the seal of the present invention is composed of a gas filled tube within a liquid filled tube, or vice versa. Examples of a seal according to the present invention are shown in more detail in FIGS. 4A, 4B, 4C and 5A and 5B. In the example shown in FIGS. 4A to 4C, the seal 26 is toroidal. FIG. 4A shows an example of a single toroidal gas filled tube 27, whereas FIG. 4B illustrates an example formed from a first toroid 27 inside which is another toroid 28. One possible implementation of the outer toroidal seal is to use tubing such as 'layflat' hose, for example Designation Ltd., Severn layflat hose 9605, for the toroid 27. The hose has to be able to withstand a sufficiently high pressure, in the order of 7 bar ($7.0 \times 10^5$ Pa), without changing circumferential length. The inner toroid 28 can be made from a smaller diameter tube, which has to be gas tight, but is not required to support a particularly high pressure difference. FIG. 4C shows an alternative option, in which a liquid filled toroid 41 is provided inside a gas filled toroid 42.

A space 29 formed between the inner tube 28 and the outer tube 27 is filled with a liquid. It is desirable that the liquid is not corrosive, or poisonous, so water is the preferred choice, but silicone or glycerol are feasible alternatives. The inside tube is filled with a gas, such as air for ease of supply and cost, but other gases such as nitrogen or argon could be used. Nitrogen is a readily available gas, which is non corrosive. Argon has the advantage, that as well as not being corrosive or poisonous, Argon is a heavy gas and does not diffuse out of the tube, as quickly as some other gases, due to its larger particle size. By contrast, Helium is not suitable, as it tends to diffuse through most non-metal materials.

In constructing the seal 26, in one example the tubes may be filled separately and the gas filled tube 28 then inserted into the water filled tube 27; in another example, while empty the inside tube 28 may be inserted into the outside tube 27, then one, then the other filled with the respective gas, or liquid. However, the order in which the tubes 27, 28 are filled and the seal constructed may be adapted for ease of manufacture. The operation of this seal, and in particular the calculation of its stiffness, is described in more detail with reference to FIGS. 5A and 5B.

Figure 5A:
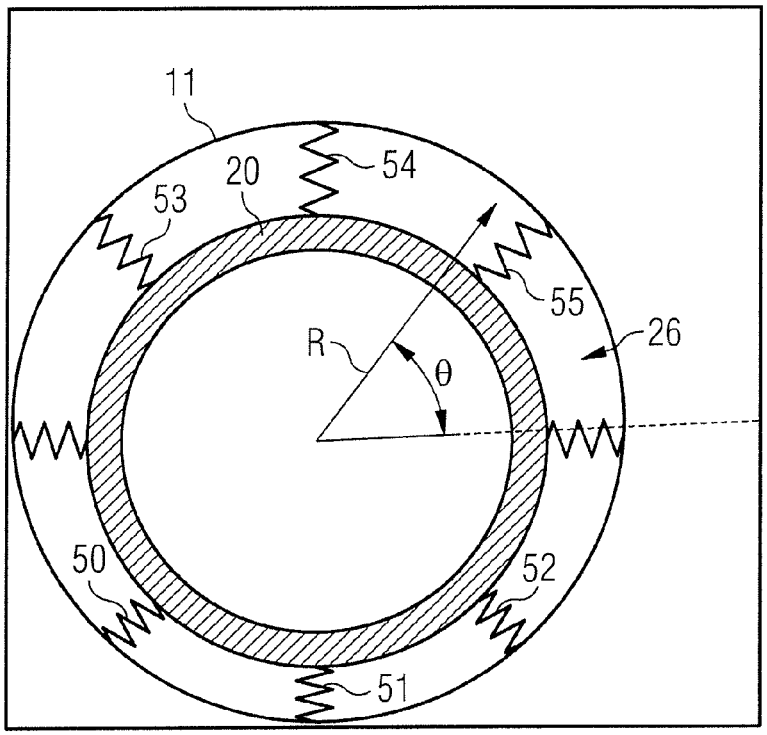
FIG. 5A is a schematic view of an end of an MRI scanner illustrating a seal in a device according to the present invention.
Figure 5B:
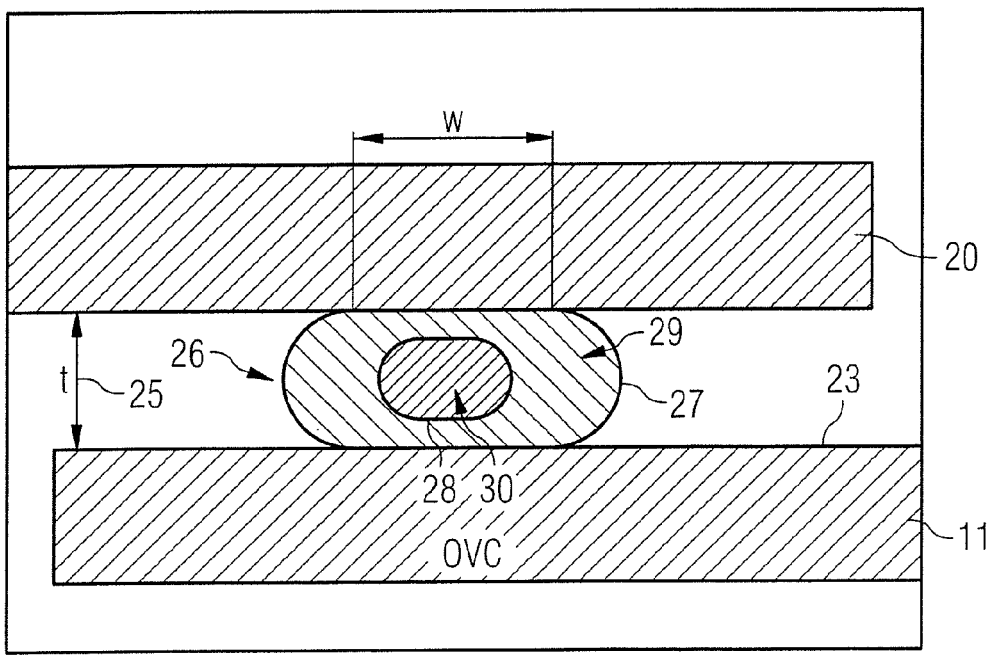
FIG. 5B shows a schematic cross section of the seal in the device according to the present invention.

The purpose of the seal is to provide an acoustic barrier, but at the same time to provide a compliant seal. To derive the compliance of the seal and some example values, reference is made to FIGS. 5A and 5B. FIG. 5A shows a schematic view of the end of an MRI scanner and FIG. 5B shows a cross section through the seal. The gradient coil assembly 20 is a tube which is supported by the circumferential seal 26. This seal behaves like a continuous spring, which, conceptually, can be considered as an infinite number of springs. For clarity only eight are illustrated in FIG. 5A

Suppose that the seal 26 has a spring constant per unit of circumferential length, k. The gradient coil assembly 20 will sag by an amount, s under its own weight, W i.e. the 'springs' 50, 51, 52 at the bottom will be compressed and the 'springs' 53, 54, 55 at the top will be extended.

$$W = R \oint k s \sin^2(\theta) d\theta \Rightarrow k = \frac{W}{s\pi R}$$

The sag, s must be less than the average gap between the gradient coil 20 and the OVC bore tube 11. Assuming a weight, W of 7000N, a radius R of 450 mm and an average gap of 5 mm, then the spring constant per unit circumferential length must be more than 990 kN/m², i.e. about 10 bar ($1.0 \times 10^6$ Pa).

To calculate the spring constant per unit length, consider the schematic cross section of the seal 26, fixed between the gradient coil assembly 20 and the OVC bore tube inner surface 23. The seal 26 has a hose 27, filled 29 with liquid and a tube 28 filled 30 with gas. The hose 27, containing the liquid, has a cross sectional circumference, C which is assumed to remain constant, i.e. the circumference of the seal does not stretch. The cross sectional circumference is given by:

$$C = 2w + \pi t. \tag{1}$$

$$\Rightarrow$$

$$w = (C - \pi t)/2$$

where t is the gap between the OVC and the gradient coil and w is the width across the seal over which the hose 27 makes contact with the gradient coil assembly 20. The pressure inside the liquid, P of the seal equals the gas pressure plus a head pressure, which is small compared with the pressure in the gas tube.

The force, f on the seal (per unit length)

$$f = Pw \tag{2}$$

The stiffness, k of the seal per unit length $$k = \frac{dP}{dt} \Rightarrow k = w\frac{dP}{dt} + P\frac{dw}{dt} \tag{3}$$

Derivation of $$\frac{dw}{dt}$$

follows from eq 1:

$$\frac{dw}{dt} = -\frac{\pi}{2} \tag{4}$$

The derivation of $$\frac{dP}{dt}$$

is as follows.

The cross-sectional area, A of the seal 26, is the sum of the cross sectional area 29 of the liquid $A_l$, and the cross-sectional area 30 of the gas, $A_g$.

As the tube is squeezed, i.e. as thickness t changes, the gas will compress and $A_g$ changes so:

$$\frac{dP}{dt} = \frac{dP}{dA_g}\frac{dA_g}{dt} \tag{5}$$

$$A_g = \left(wt + \pi\frac{t^2}{4}\right) - A_l \tag{6}$$

$$\Rightarrow \frac{dA_g}{dt} = \frac{C}{2} - \frac{2\pi t}{4}$$

$$\Rightarrow \frac{dA_g}{dt} = w$$

To derive $$\frac{dP}{dA_g}$$

it is assumed that the gas is adiabatically compressed, as is well known in thermodynamics, so:

$$\frac{dP}{dA_g} = -\frac{c_v}{c_p}\frac{P}{A_g} \tag{7}$$

where $$\frac{c_v}{c_p}$$

is the ratio between the specific heat of the working gas at constant volume and the specific heat of the working gas at constant pressure. For air this constant equals 7/5.

Finally, substitute equations 1, 4, 6 and 7 into equation 3:

$$k = \frac{(c-\pi t)^2}{4}\left(-\frac{c_v}{c_p}\frac{P}{A_g}\right) - \frac{\pi P}{2} \Rightarrow k = -P\left(\frac{c_v(c-\pi t)^2}{4c_p A_g} + \frac{\pi}{2}\right)$$

For example: Assuming air as the working gas, a width $w = (c-\pi t)/2$ of 10 mm, a cross sectional gas area $A_g$ of 50 mm² and a fill pressure P of 4.5 bar ($4.5 \times 10^5$ Pa), this gives a spring constant per unit length of 10.2 bar ($1.02 \times 10^6$ Pa). To stop the liquid and gas redistributing along the perimeter of the seal, i.e. in the θ direction, and in particular at the top, such movement may be constrained by sectioning both the gas and the liquid volumes.

The seal provides good vibrational decoupling of the gradient coil assembly from the OVC. The density of the liquid filled seal provides an effective acoustic barrier. In a further embodiment, shown in the example of FIG. 6, with the same arrangement of magnet system 1 and gradient coil assembly 20 as for the example of FIG. 3, so the details will not be repeated here, in addition to end seals a number of further seals 26 are provided along the length of the gradient coil assembly. In the example shown, the seals have the form illustrated in FIG. 4B or 4C. The spacing between each of these seals may be adjusted along the length according to the desired position of the gradient coil assembly, but generally, the multiple seals are positioned with equal spacing along the length and with gaps 36 between each seal.

Figure 7:
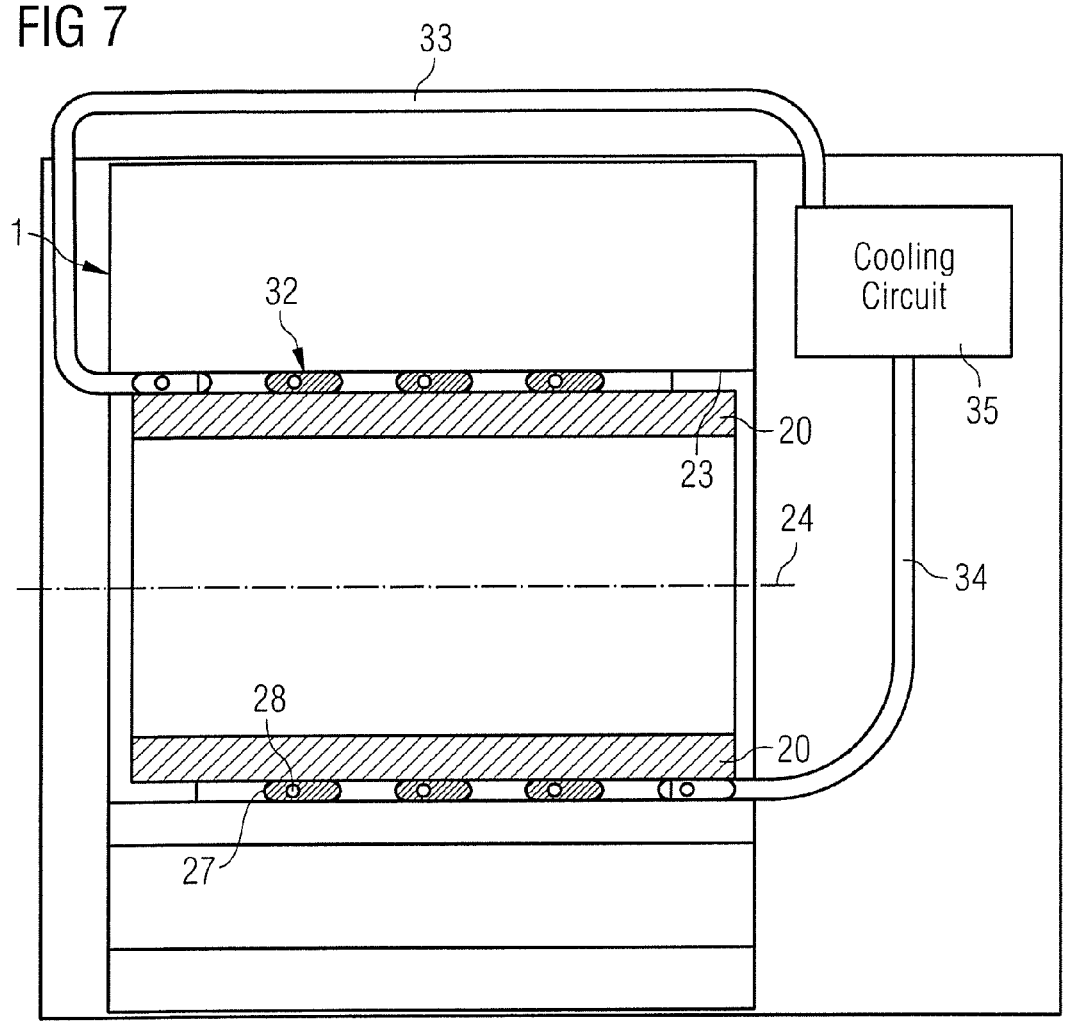
FIG. 7 illustrates a third example of a magnetic resonance device according to the present invention, using a helical seal.

FIG. 7 illustrates a further alternative example, again with the same arrangement of magnet system 1 and gradient coil assembly 20 as for the example of FIG. 3, in which the seal is formed as a helical tube 32. As for the toroidal examples, in its simplest form, one embodiment of the invention provides a single gas filled tube, but in this case the tube is helically wound along the length of the gradient coil assembly 20. The example of FIG. 7 illustrates the use of two tubes, one within the other, where the inner tube 28 is gas filled and the outer tube 27 is liquid filled according to the same criteria as described above for the toroidal examples of FIGS. 4 and 5.

Figure 8:
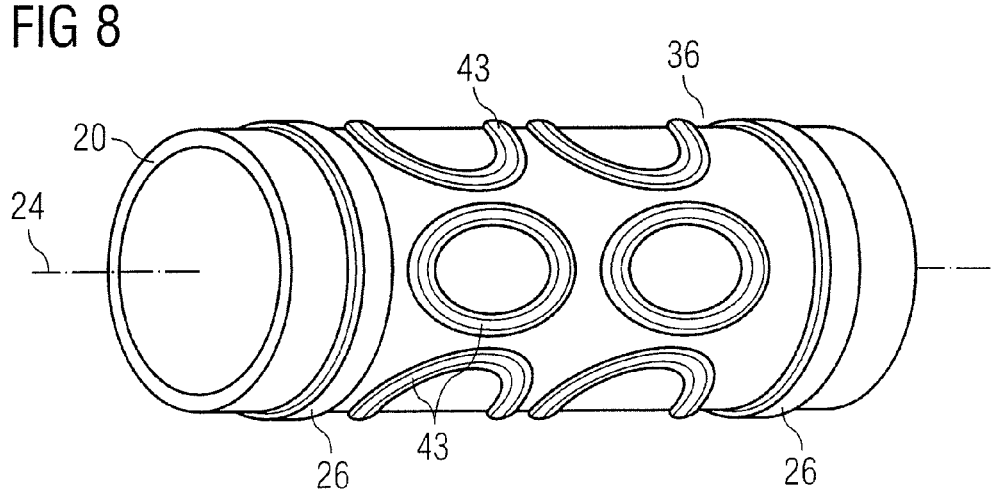
FIG. 8 shows a further example of the present invention provided with saddle shaped seals.

FIG. 8 illustrates another example, also with the same arrangement of magnet system 1 and gradient coil assembly 20 as for the example of FIG. 3, but in this case, two end seals of the type shown in FIG. 3 are provided. In addition, between the two end seals 26, a plurality of saddle shaped seals are fixed around the gradient coil assembly. There may be, for example, eight seals 43, whose pressure can be adjusted to provide adjustment in the X and Y direction and tilt in pitch and yaw.

Figure 6:
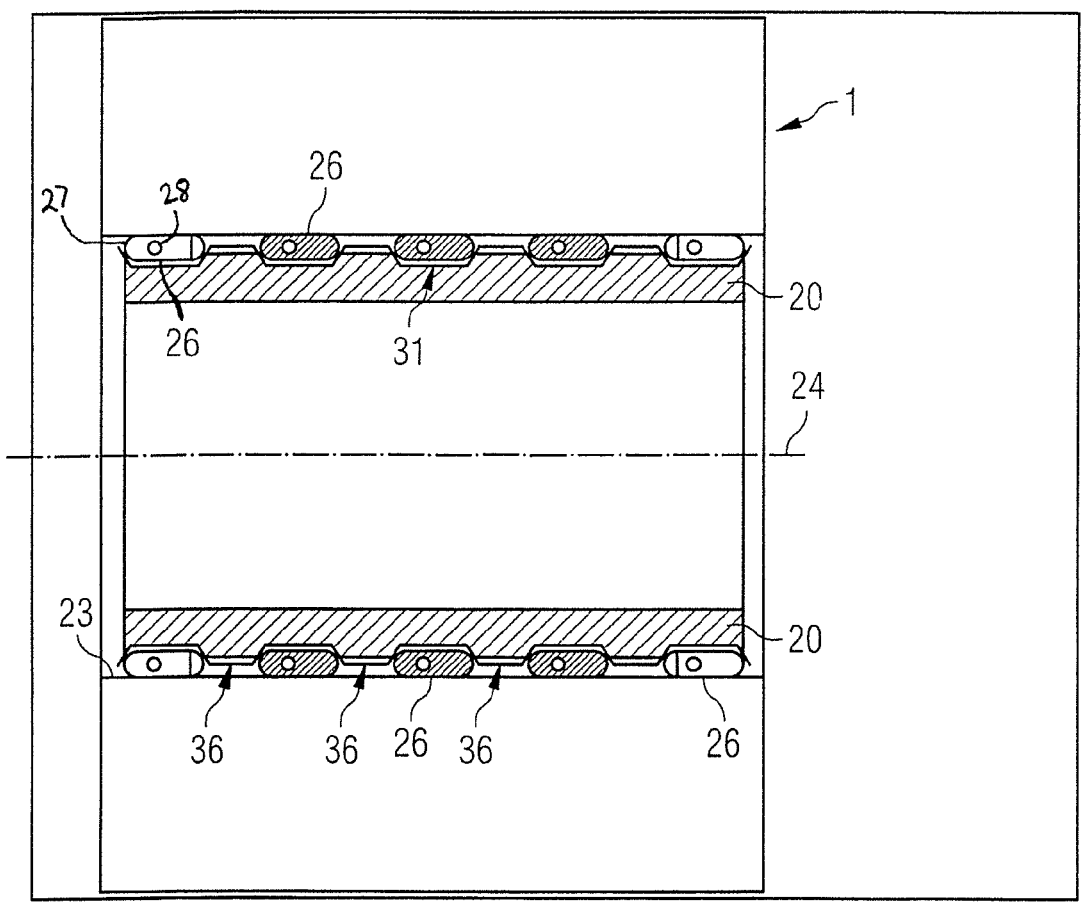
FIG. 6 illustrates a second example of a magnetic resonance device according to the present invention, using multiple seals.

In any of the described examples, the gradient coils of the gradient coil assembly may be embedded in a resin former and the seal or seals may be seated in a groove 31 formed in resin of the gradient coil assembly 20 to give good axial stability. Combining this groove with a shoulder (not shown) on each end of the OVC bore 23, further improves the axial stability. In the examples of FIGS. 3, 6 and 8, gaps 36 between each of the seals 26 may be evacuated, resulting in a further reduction in acoustic transmission.

In a further embodiment, illustrated for the helical seal example in FIG. 7, the liquid in the seal can be made part of a cooling circuit 35 and thus provide another cooling surface on the outside of the gradient coil assembly 20. Fluid, typically water, is cooled in the cooling circuit 35 and pumped through pipes 33 into the helical tube 32. Water exiting the helical tube at the far end of the gradient coil assembly 20 is returned to the cooling circuit via pipe 34. This may be adapted accordingly for use with the toroidal seal embodiments.

Although modifications and changes may be suggested by those skilled in the art, it is the intention of the inventor to embody within the patent warranted hereon all changes and modifications as reasonably and properly come within the scope of his or her contribution to the art.

I claim as my invention:

1. A magnetic resonance apparatus comprising:
   a cryostat having an inner bore extending therethrough;
   a gradient coil assembly located within said inner bore of the cryostat;
   a seal between said gradient coil assembly and said inner bore; and
   said seal comprising:
      a first toroid mounted concentrically with respect to said gradient coil assembly and defining a first interior volume filled with a first fluid, and
      a second toroid defining a second interior volume filled with a second fluid, wherein said second toroid is disposed within said first fluid filling said first interior volume of said first toroid, and wherein said first toroid and said second toroid are substantially concentric.

2. An apparatus as claimed in claim 1 wherein said gradient coil assembly has opposite ends, and wherein said seal is a first seal located at a first of said opposite ends of said gradient coil assembly, and wherein said apparatus comprises a second seal comprising:
   a third toroid mounted concentrically with respect to said gradient coil assembly and defining a third interior volume filled with said first fluid, and
   a fourth toroid defining a fourth interior volume filled with said second fluid, wherein said fourth toroid is disposed within said first fluid filling said third interior volume of said third toroid, and wherein said third toroid and said fourth toroid are substantially concentric,
said second seal being located at a second of said opposite ends of said gradient coil assembly.

3. An apparatus as claimed in claim 2 wherein said first and second seals have a space therebetween, and wherein said space is evacuated.

4. An apparatus as claimed in claim 1 wherein said first fluid is a liquid, and wherein said second fluid is a gas.

5. An apparatus as claimed in claim 4 wherein said gas in said second toroid is at a higher pressure than the liquid in said first toroid.

6. An apparatus as claimed in claim 4 comprising a cooling circuit, and wherein said cooling circuit cools said liquid in said first toroid.

7. An apparatus as claimed in claim 4 wherein said gas is selected from the group consisting of air, argon and nitrogen.

8. An apparatus as claimed in claim 1 wherein said first fluid is a gas and wherein said second fluid is a liquid.

9. An apparatus as claimed in claim 1 wherein said first toroid comprises a layflat hose.

10. An apparatus as claimed in claim 1 comprising a plurality of further seals situated around said gradient coil assembly.

11. An apparatus as claimed in claim 10 wherein each of said further seals comprises a fluid-filled toroid.

12. An apparatus as claimed in claim 10 wherein said plurality of further seals are respectively substantially equally spaced along a length of said gradient coil assembly.

13. An apparatus as claimed in claim 10 wherein each of said plurality of further seals is saddle-shaped.

14. An apparatus as claimed in claim 10 wherein each of said seal and said plurality of further seals has a pressure and a spring constant that is adjusted to set an orientation of said gradient coil assembly within said inner bore.

15. An apparatus as claimed in claim 10 wherein said gradient coil assembly comprises a resin former and gradient coils embedded therein, and wherein said former has a plurality of grooves therein in which said seal and said further seals are respectively seated.

16. An apparatus as claimed in claim 1 wherein said gradient coil assembly comprises a resin former and gradient coils embedded therein, said resin former having a groove therein in which said seal is seated.

17. A magnetic resonance apparatus comprising:
   a cryostat having an inner bore extending therethrough;
   a gradient coil assembly situated within said inner bore of said cryostat;
   a seal between said gradient coil assembly and said inner bore; and said seal comprising:
a first helix mounted concentrically with respect to said gradient coil assembly and defining a first interior volume filled with a first fluid, and
a second helix defining a second interior volume filled with a second fluid, wherein said second helix is disposed within said first fluid filling said first interior volume of said first helix, and wherein each turn of said first helix is substantially concentric with a corresponding turn of said second helix.

18. An apparatus as claimed in claim 17 wherein said first fluid is a liquid and wherein said second fluid is a gas.

19. An apparatus as claimed in claim 18 comprising a cooling circuit in communication with said liquid in said first helix to cool said liquid.

20. An apparatus as claimed in claim 1, wherein the gradient coil assembly and the inner bore are cylindrical.

* * * * *